United States Patent [19]
French et al.

[11] Patent Number: 6,160,455
[45] Date of Patent: Dec. 12, 2000

[54] DERIVED POWER SUPPLY FOR COMPOSITE BRIDGE AMPLIFIERS

[75] Inventors: John Barry French, Caledon East; David I. W. Russell, Toronto, both of Canada

[73] Assignee: Indigo Manufacturing Inc., Markham, Canada

[21] Appl. No.: 09/037,874

[22] Filed: Mar. 10, 1998

[51] Int. Cl.[7] ............................... H03F 1/02; H03F 3/04
[52] U.S. Cl. ............................................ 330/297; 330/298
[58] Field of Search .................................. 330/297, 298, 330/207 P, 267, 285

[56] References Cited

U.S. PATENT DOCUMENTS

| | | | |
|---|---|---|---|
| 4,321,554 | 3/1982 | Quilter | 330/297 |
| 4,571,554 | 2/1986 | Martin et al. | 330/297 |

*Primary Examiner*—Michael B Shingleton
*Attorney, Agent, or Firm*—Bereskin & Parr

[57] ABSTRACT

A composite bridge amplifier in which the power supply for the bridge amplifiers includes a time varying non-ground reference DC voltage supply dependant on the input signal. A low voltage power supply circuit uses the time varying non-ground reference DC voltage to produce a fixed DC voltage and includes a centering block which removes unbalanced DC voltages which might otherwise contaminate the time varying non-ground reference DC voltage, by providing balancing currents. This eliminates a costly transformer. Safety isolation is provided using an isolation amplifier with a transformer which has a parasitic capacitance. Improved common mode noise rejection is provided by configuring the isolation amplifier so that currents charging the parasitic capacitance with common mode noise voltage tend to cancel noise current in the secondary winding of the transformer.

14 Claims, 7 Drawing Sheets

DERIVED POWER SUPPLY FOR COMPOSITE BRIDGE AMPLIFIERS

FIELD OF THE INVENTION

This invention relates to power supply circuits for amplifiers. More particularly, the present invention relates to an improved circuit for supplying power to a composite bridge amplifier.

BACKGROUND OF THE INVENTION

A composite bridge amplifier is disclosed in U.S. Pat. No. 5,075,634. This amplifier comprises a combination of a single-ended Class D amplifier and a linear Class AB bridge amplifier. The output of the Class D amplifier provides the supply voltage for the bridge amplifier. This supply voltage is dependent on the signal to be amplified, producing a small voltage drop across the output voltage sources in the bridge amplifier. This substantially reduces the power dissipated in the voltage sources, providing a highly efficient amplifier with Class AB type performance.

A second composite bridge amplifier is disclosed in U.S. Pat. No. 5,510,753. This amplifier provides a closed loop control system for the Class D amplifier, improving the performance of the amplifier and eliminating the need for a time delay element which was required in the prior art. In addition, this amplifier incorporates current overload protection and thermal overload protection stages which protect the output stage.

In each of these known composite bridge amplifiers there are signal conditioning electronics and control electronics which are powered by separately generated low voltage power rails. Generation of these independent rails requires the use of a power transformer and additional circuitry. The cost of the composite bridge amplifier may be reduced by generating the low voltage power rails from the power rails used to power the bridge amplifier.

BRIEF SUMMARY OF THE INVENTION

Accordingly, it is an object of this invention to provide an improved composite bridge amplifier which can be manufactured at lower cost than known devices.

In one aspect the invention provides a power supply circuit for generating a fixed DC voltage from a time-varying non-ground referenced DC voltage comprising:

(a) first and second voltage input terminals for receiving said time-varying non-ground referenced DC voltage;

(b) first and second voltage output terminals for outputting said fixed DC voltage;

(c) a regulator block coupled to said first and second voltage input terminals and to said first and second voltage output terminals and having an output voltage fixing block and a voltage drop block; and (d) a centering block for removing unbalanced DC voltages at said first and second voltage input terminals, said centering block being coupled to said first and second voltage input terminals and comprising a bias point block for establishing a bias voltage and a current compensation block coupled to said bias point block and responsive to said bias voltage for providing currents to balance the voltages at said first and second voltage input terminals.

In another aspect the invention provides a safety isolation circuit comprising (a) a signal input terminal for receiving an input signal from an input device, wherein said input device has a source impedance of less than 1 kΩ;

(b) a signal output terminal for outputting an isolated signal corresponding to said input signal;

(c) an input block comprising an input amplifier having input amplifier input and output terminals and a coupling capacitor coupled between said input amplifier output terminal and said signal output terminal; and (d) an isolation block comprising an isolation transformer having a primary winding having a primary start terminal and a primary finish terminal, and a secondary winding having a secondary start terminal and a secondary finish terminal, there being a parasitic capacitance between said windings representable as a start terminal capacitance between said primary terminals and a finish terminal capacitance between said finish terminals, said primary winding being coupled to said signal input terminal, said secondary winding being coupled to said input amplifier input terminal through first and second resistors, said input amplifier being connected as a differential amplifier and said isolation transformer being selected such that the start terminal capacitance and the finish terminal capacitance are each less than 10 pF and such that the difference between the start terminal capacitance and finish terminal capacitance is less than 0.4 pF.

In yet another aspect the invention provides a safety isolation circuit comprising (a) a signal input terminal for receiving an input signal;

(b) a signal output terminal for outputting an isolated signal corresponding to said input signal;

(c) an input block comprising an input amplifier having input amplifier input and output terminals and a coupling capacitor coupled between said input amplifier output terminal and said signal output terminal; and (d) an isolation block comprising an isolation transformer having primary and secondary windings, said primary winding have a primary start terminal and a primary finish terminal, said secondary winding having a secondary start terminal and a secondary finish terminal, there being a parasitic capacitance between said windings representable as a start terminal capacitance between said primary terminals and a finish terminal capacitance between said finish terminals, said primary start terminal being coupled to said signal input terminal through a resistor, said primary finish terminal being connected to said signal input terminal, said secondary start terminal being connected to said amplifier input terminal, said secondary finish terminal being connected to said input amplifier terminal and to ground, said isolation amplifier being configured such that currents charging said parasitic capacitance with common mode noise voltage tends to cancel common mode noise current in said secondary winding.

In still another aspect the invention provides an amplifier for amplifying an input signal, said amplifier comprising:

(a) a signal input terminal for receiving said input signal from an input device;

(b) a safety isolation circuit coupled to said signal input terminal, said safety isolation block being adapted to provide a signal corresponding to said input signal at a signal output terminal;

(c) a signal amplifier block having first and second voltage input terminals and a control terminal, said control terminal being coupled to said signal output terminal;

(d) an AC power rectification block for providing a fixed DC voltage at first and second DC voltage terminals;

(e) an amplifier power supply block coupled to said first and second DC voltage terminals for producing at said first and second voltage input terminals a time-varying non-ground referenced DC voltage dependent on said input signal;

(f) an amplifier power control circuit coupled to said signal input terminal and said amplifier power supply block for controlling said time-varying non-ground referenced DC voltage;

(g) a startup block adapted to generate a startup signal and coupled to said amplifier power control circuit, said amplifier power control circuit being responsive to said startup signal to control said amplifier power supply block such that said amplifier power supply block produces a fixed non-ground referenced DC voltage at said first and second voltage input terminals for a specified period of time;

(h) an electronics power supply circuit coupled to said first and second voltage input terminals for producing a fixed DC voltage at first and second voltage output terminals from said time-varying non-ground referenced DC voltage.

DETAILED DESCRIPTION OF THE PREFERRED EMBODIMENT

Figure 1:
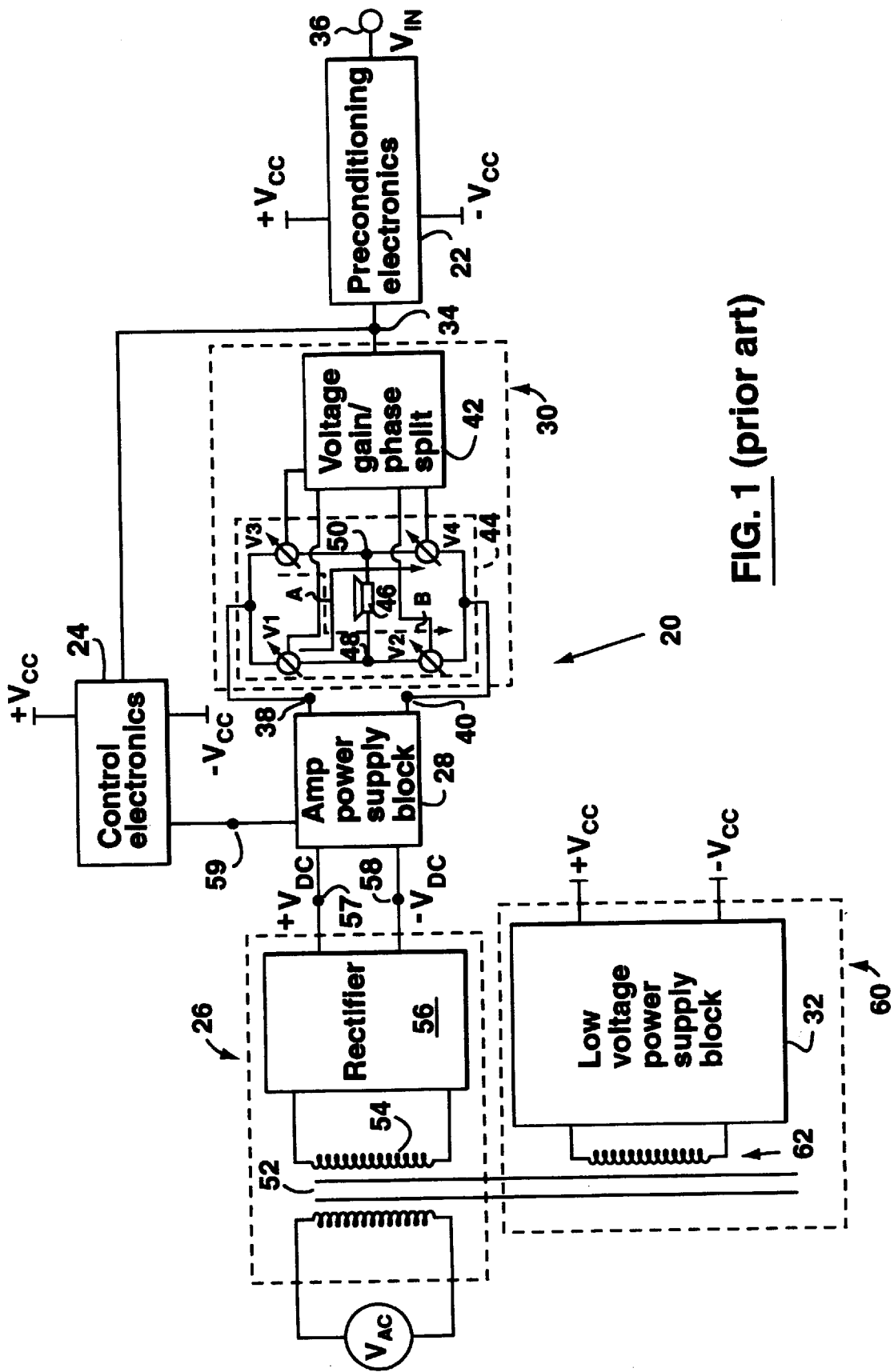
FIG. 1 shows a block diagram of the prior art composite bridge amplifier.

Reference is first made to FIG. 1, which shows a typical prior art composite bridge amplifier 20. The operation of this bridge amplifier will be understood by one skilled in the art with reference to U.S. Pat. No. 5,075,634 and the disclosure and drawings of that patent are incorporated herein by this reference. The operation of the prior art bridge amplifier may be described here briefly.

The prior art composite bridge amplifier 20 comprises an input terminal 36, a preconditioning electronics block 22, a control electronics block 24, an AC voltage source $V_{AC}$, an amplifier power rectification block 26, an amplifier power supply block 28, a bridge amplifier block 30 and a low voltage power supply block 60.

The AC voltage source $V_{AC}$ will normally be a household AC power line. The amplifier power rectification block comprises a power transformer 52 and a rectifier 56. Secondary winding 54 of power transformer 52 and rectifier 56 are configured in known manner to step down and rectify the voltage supplied by AC voltage source $V_{AC}$ to provide positive and negative DC voltages $+V_{DC}$ and $-V_{DC}$ at terminals 57 and 58, respectively.

In operation, an input signal $V_{in}$ (typically an audio input signal) is coupled to the input terminal 36. This input signal is directed to the preconditioning electronics block 22, which may comprise a preamplifier. The output of the preconditioning electronics block 22 is split at terminal 34.

One part of the preconditioned signal is directed to the bridge amplifier block 30, which comprises a Voltage gain/phase splitter block 42 and a power gain stage 44. The coupling between terminal 34 and bridge amplifier block 30 may include a time delay stage (not shown), depending on the construction of the composite bridge amplifier. The preconditioned signal is phase split and amplified by voltage gain/phase splitter block 42 to control controllable voltage sources (each of which may comprise a transistor) V1 to V4 comprising power gain stage 44. Controllable voltage sources V1 to V4 are connected in a bridge configuration. The output of the power gain stage 44 appears at terminals 48 and 50 and drives a load or speaker 46. The power gain stage 44 is comprised essentially of two push-pull amplifiers driven 180 degrees out of phase from one another. During one half cycle of the input signal $V_{in}$, controllable voltage sources V1 and V4 are on and current flows through load 46 in one direction as shown by solid line A. During the other half cycle, controllable voltage sources V2 and V3 are on and current flows through load 46 in the other direction as shown by dashed line B. (The operation and the design of bridge amplifier block 30 is fully described in U.S. Pat. No. 5,075,634.)

The other part of the preconditioned signal is directed to the control electronics block 24, which provides a pulse width modulated gate drive signal at terminal 59 corresponding to the input signal $V_{in}$. This pulse width modulated gate drive signal is used to control the amplifier power supply block 28, which generates positive and negative amplifier power rails $+V_{AMP}$ and $-V_{AMP}$, at terminals 38 and 40, respectively from the DC voltages $+V_{DC}$ and $-V_{DC}$ at terminals 57 and 58, respectively. These power rails (at terminals 38, 40) are time varying and should be symmetric about ground (i.e. they should be of equal magnitude and opposite polarity) at all times. (The operation of the control electronics block 24 and the amplifier power supply block 28 is fully described in U.S. Pat. No. 5,075,634.)

The preconditioning electronics block 22 and the control electronics block 24 of the prior art composite bridge amplifier 20 are powered by a separate power supply, generated independently from the AC voltage source $V_{AC}$ in low voltage power supply block 60.

Figure 2:
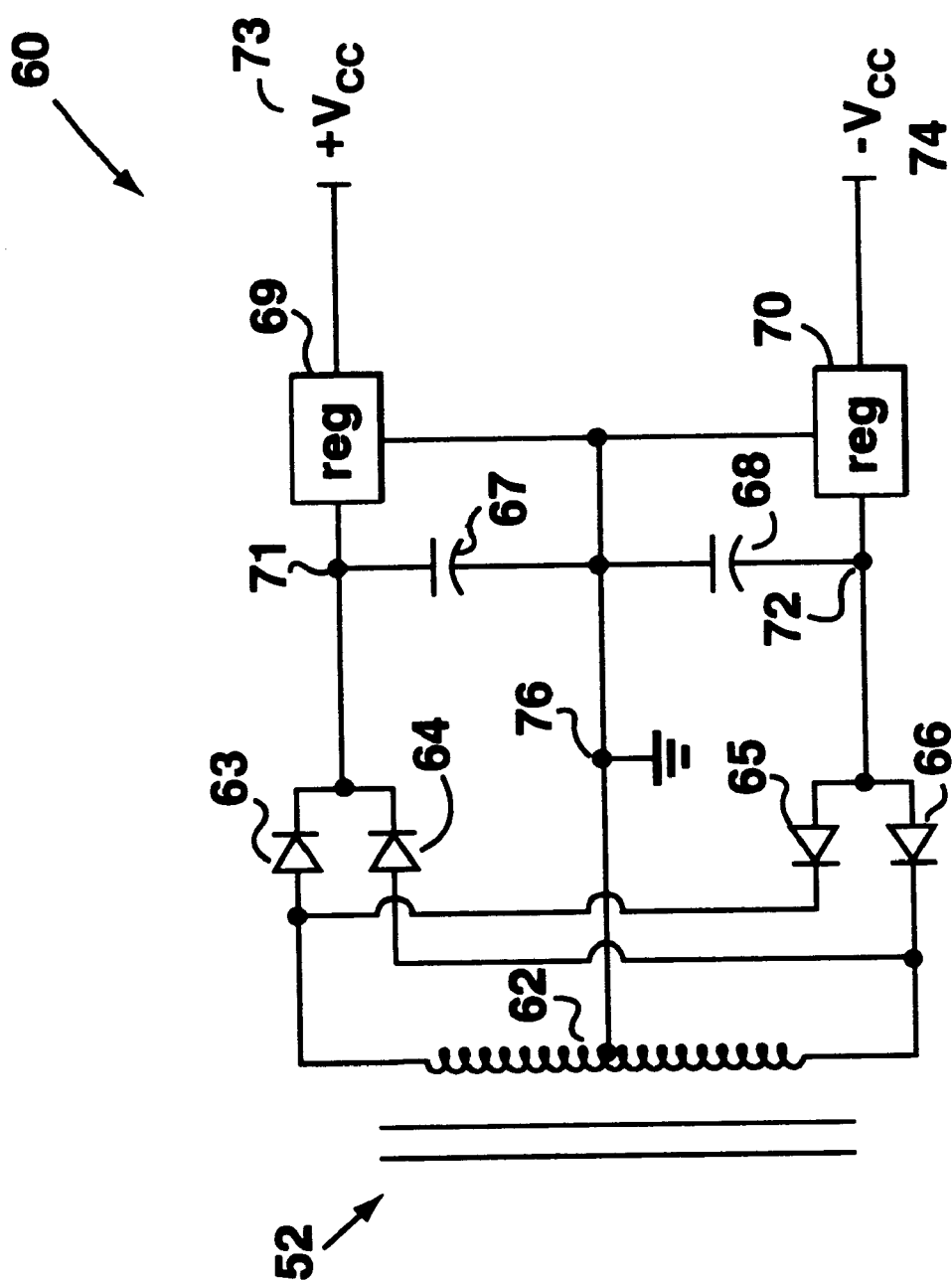
FIG. 2 shows a prior art low voltage power supply block.

Reference is next made to FIG. 2, which shows the prior art low voltage power supply block 60 in detail. The low voltage power supply block 60 is comprised of a secondary winding 62 of transformer 52, diodes 63 to 66, capacitors 67 and 68 and regulators 69 and 70.

Secondary winding 62, diodes 63 to 66 and capacitors 67 and 68 are connected as shown as two voltage rectifiers, the operation of which will be well known to those skilled in the art. The output of these regulators, at terminals 71 and 72, are two rectified DC voltage rails.

Regulators 69 and 70 are optional and may include additional voltage conditioning electronics to step up or step down the voltages at terminals 71 and 72. One skilled in the art will be capable of designing regulators appropriate to the particular application of the bridge amplifier 20. The output of the regulators will be low voltage power rails $+V_{CC}$ and $-V_{CC}$ at terminals 73 and 74, respectively. If no additional regulation of the rectified DC voltage supplies is required, terminals 71 and 72 may be connected directly to terminals 73 and 74, respectively. The output voltage rails, $+V_{CC}$ at terminal 73 and $-V_{CC}$ at terminal 74, are used to supply power to the preconditioning electronics block 22 and control electronics block 24.

The center tap of secondary winding 62 is connected to ground at terminal 76. This connection provides a return path for any ground currents generated in control electronics block 24 and preconditioning electronics block 22. The use of the secondary winding 62, which is independent of the secondary winding 54, results in low voltage power supply block 60 being floating from the amplifier power supply block 28. As a result, any ground currents generated in control electronics block 24 or preconditioning electronics block 22 will not affect the operation of amplifier power supply block 28 amplifier voltage or the amplifier power rails $+V_{AMP}$ and $-V_{AMP}$. This independence of the amplifier power rails $+V_{AMP}$ and $-V_{AMP}$ and the low voltage power rails $+V_{CC}$ and $-V_{CC}$ is necessary to ensure that the amplifier power rails are symmetric about ground. If the amplifier power rails $+V_{AMP}$ and $-V_{AMP}$ are not symmetric about ground, the maximum positive and negative voltage swings across the load 46 will not be equal. If the amplifier is used as an audio amplifier, this may lead to distortion of the output waveform.

Although the prior art composite bridge amplifier 20 is highly efficient, the amplifier is expensive due to the need for an expensive power transformer with several independent secondary windings. The need for a power transformer may be eliminated by deriving the low voltage power rails $+V_{CC}$ and $-V_{CC}$ from the time varying amplifier power rails $+V_{AMP}$ and $-V_{AMP}$ generated by amplifier power supply block 28.

Figure 3:
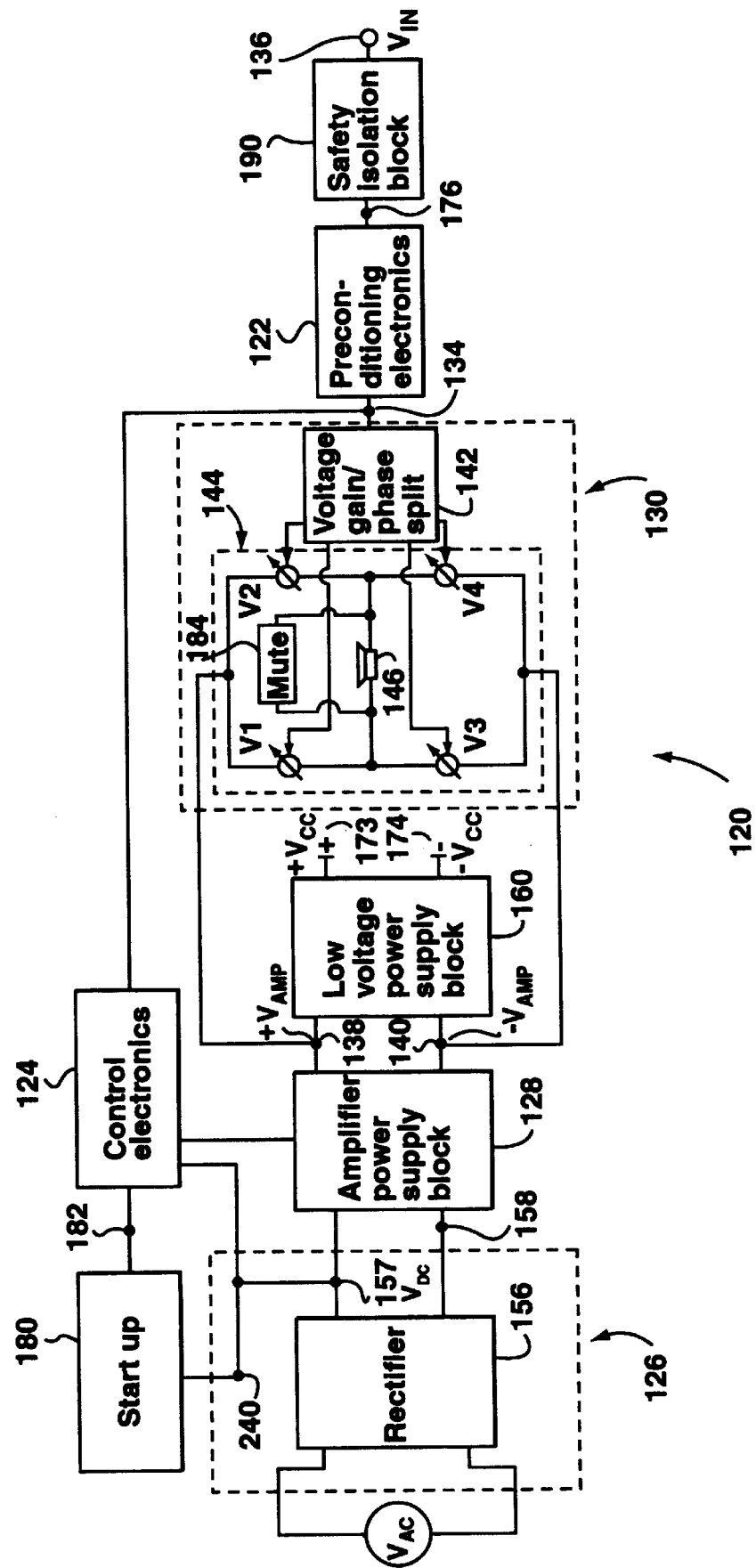
FIG. 3 shows a block diagram of a composite bridge amplifier implemented according to the present invention.

Reference is next made to FIG. 3, which shows an improved composite bridge amplifier 120 according to the present invention.

The improved composite bridge amplifier 120 comprises an input terminal 136, a safety isolation block 190, a preconditioning electronics block 122, a control electronics block 124, an AC voltage source $V_{AC}$, an AC power rectification block 126, amplifier power supply block 128, a low voltage power supply block 160, a bridge amplifier block 130 and start up block 180.

The steady state operation of the improved composite bridge amplifier 120 remains substantially the same as the operation of the prior art composite bridge amplifier 20. The operation of the preconditioning electronics block 122, AC voltage source $V_{AC}$, amplifier power supply block 128 and bridge amplifier block 130 is the same as the operation of the analogous components in the prior art composite bridge amplifier 20. The operation of the control electronics block 124 is substantially the same as the control electronics block 24 in the prior art, with the modifications discussed below.

The AC power rectification block 126 comprises a rectifier 156 coupled to the AC voltage source $V_{AC}$. Transformer 52, which was present in the prior art AC power rectification block 26 is no longer required. The rectifier 156 may comprise a diode bridge (not shown) configured in known manner to rectify the AC voltage supplied by AC voltage source $V_{AC}$ to DC voltages $+V_{DC}$ and $-V_{DC}$ at terminals 157 and 158, respectively. These DC voltages $+V_{DC}$ and $-V_{DC}$ are directed to the amplifier power supply block 128, which operates as in the prior art to generate the amplifier power rails $+V_{AMP}$ and $V_{AMP}$ at terminal 138 and 140 respectively.

The elimination of the transformer 52 from AC power rectification block 126 is one of the principal advantages of the present invention. This permits the improved composite bridge amplifier 120 to be manufactured at lower cost with lower weight.

In the prior art composite bridge amplifier 20, transformer 52 provided safety isolation between the AC voltage source $V_{AC}$ and the input terminal 36. Since transformer 52 is not used in the improved composite bridge amplifier 120, a safety isolation block 190 is used to provide safety isolation. The operation of safety isolation block 190 is explained in detail below.

The low voltage power supply block 60 in the prior art composite bridge amplifier has been replaced by the low voltage power supply block 160 in the improved composite bridge amplifier 120. The low voltage power supply block 160 generates the low voltage power rails $+V_{CC}$ and $-V_{CC}$ from the time varying positive and negative amplifier power rails $+V_{AMP}$ and $-V_{AMP}$ as described in detail below.

In steady state operation of the improved composite bridge amplifier 120, the control electronics block 120, the preconditioning electronics block 122 and other components which may be required depending on the specific application of the improved composite bridge amplifier 120 will be powered from the low voltage power rails $+V_{CC}$ and $-V_{CC}$.

One skilled in the art will recognize that this arrangement creates a problem when the improved composite bridge amplifier is first turned on. The positive and negative amplifier voltage rails $+V_{AMP}$ and $-V_{AMP}$ cannot be generated until the control electronics block 124 is powered, and the control electronics block 124 cannot operate until the low voltage power rails $+V_{CC}$ and $-V_{CC}$, which are derived from the amplifier voltage rails $+V_{AMP}$ and $-V_{AMP}$, have been generated. This problem is solved by adding startup control block 180 and by coupling both the startup control block 180 and the control electronics block 124 to the $+V_{DC}$ output of the AC power rectification black 156 at terminal 157.

During the startup operation of the improved composite bridge amplifier 120, the startup control block 180 generates a startup signal at terminal 182. The startup signal is directed to the control electronics block 124. In response to the startup signal, the control electronics block 124 generates a pre-programmed startup pulse width modulated gate drive signal. The pre-programmed startup pulse width modulated gate drive signal is directed to amplifier power supply block 128, causing amplifier power supply block 128 to generate the positive and negative amplifier voltage rails $+V_{AMP}$ and $-V_{AMP}$. The low voltage power supply block 160 then generates corresponding voltages on the low voltage power rails $+V_{CC}$ and $-V_{CC}$. Once sufficient time has elapsed that these voltages have been generated, the startup control block 180 removes the startup signal from terminal 182 and the control electronics block 124 enters steady state operation, taking its power from the low voltage power rails $+V_{CC}$ and $-V_{CC}$.

During the startup operation, it will take some time for the amplifier voltage rails $+V_{AMP}$ and $-V_{AMP}$, and consequently, the low voltage power rails $+V_{CC}$ and $-V_{CC}$ to stabilize. As a result, the power supply to the amplifier block 130 may be unstable. Since the preconditioning electronics are powered from the low voltage power rails $+V_{CC}$ and $-V_{CC}$, the preconditioned signal which appears at terminal 134 may also be unstable. As a result of either or both of these unstable conditions, the output of the bridge amplifier lock 130 across the load 146 may be unstable. In order to protect the speaker 146, and to prevent an undesirable output transient, a mute circuit 184 has been added to the bridge amplifier block 130. The mute circuit 184 will disable the output of the composite bridge amplifier 120 until the amplifier voltage rails $+V_{AMP}$ and $-V_{AMP}$ and the low voltage power rails $+V_{CC}$ and $-V_{CC}$ have stabilized. The mute circuit may also be designed to mute the output of the improved composite bridge amplifier when the amplifier is turned off to similarly avoid an undesirable output transient. Mute circuits are well known in the prior art and the design of the mute circuit 184 will not be further described here. One skilled in the art will be able to design a mute circuit 184 appropriate to the particular application in which the improved composite bridge amplifier is to be used.

Figure 4:
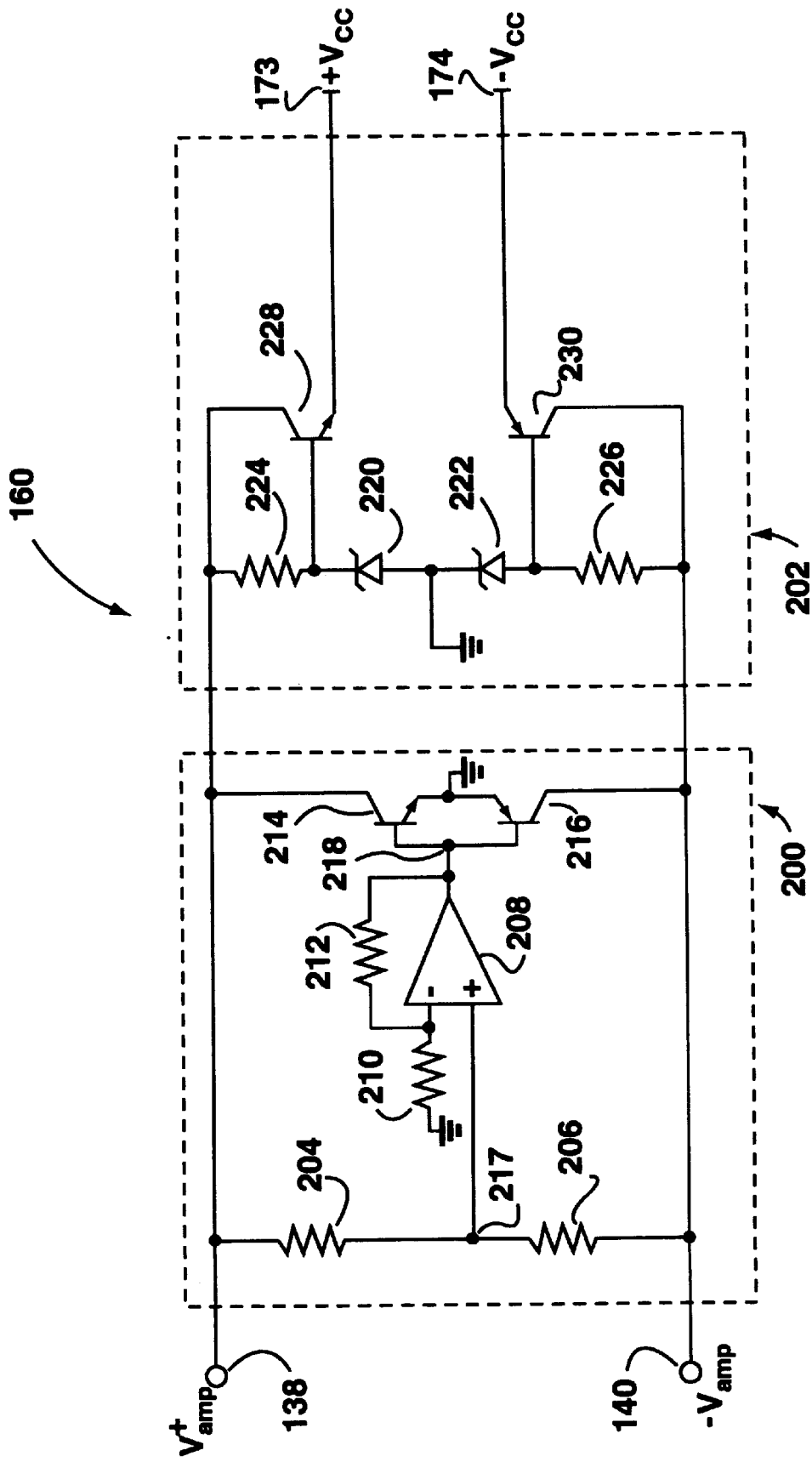
FIG. 4 is a schematic of the low voltage power supply block of FIG. 3.

Low Voltage Power Supply Block 160 (FIG. 4)

The structure and operation of the low voltage power supply block 160 will now be described with reference to FIG. 4, which shows the low voltage power supply block 160 in block diagram form.

The low voltage power supply block 160 comprises a centering block 200 and a regulator block 202.

In the prior art composite bridge amplifier 20, the low voltage power supply block 60 (FIG. 2) comprised a rectifier network comprised of diodes 63 to 66 and capacitors 67 and 68 to rectify an AC input voltage to a DC voltage at terminals 71 and 72. In the improved composite bridge amplifier 120, the low voltage power supply block 160 receives DC voltages from the amplifier power rails $+V_{AMP}$ and $-V_{AMP}$ from the amplifier power supply block 128 at terminals 138 and 140. The need for a rectifier network is thus eliminated.

The regulator block 202 steps down the time varying DC voltages $+V_{AMP}$ and $-V_{AMP}$ supplied by the amplifier supply block 128 at terminals 138 and 140, respectively, to generate the low voltage power rails $+V_{CC}$ and $-V_{CC}$ at terminals 173 and 174, respectively.

The regulator block 202 is comprised of two zener diodes 220 and 222, two resistors 224 and 226 and two transistors 228 and 230. The collector of transistor 228 is connected to terminal 138. Resistor 224 is connected across the collector and base of transistor 228. The cathode of zener diode 220 is connected to the base of transistor 228 and the anode of zener diode 220 is connected to ground. The voltage at terminal 173 will be equal to the voltage of zener diode 220 less the voltage dropped across the base-emitter junction of transistor 228. Any undesired voltage will be dropped across transistor 228 and resistor 224. Thus, the voltage at terminal 173 may be precisely controlled by the selection of zener diode 220. Zener diode 222, resistor 226 and transistor 230 are connected in an analogous manner to provide a controlled voltage at terminal 174.

Although the regulator block 202 is shown with transistors 228 and 230, any series pass element may be used to drop the unnecessary voltage between terminals 138 and 173 or between terminals 140 and 174. If the load currents of the control electronics block 124 and the preconditioning electronics block 122 and any other devices which are powered by the low voltage power supply rails $+V_{CC}$ and $-V_{CC}$, are sufficiently low, the series pass element may be removed altogether. Terminal 173 will then be connected between resistor 224 and zener diode 220 and terminal 174 will be connected between resistor 226 and zener diode 222. Any unnecessary voltage will be dropped across resistors 224 and 226.

One skilled in the art will recognize that the voltage $+V_{AMP}$ at terminal 138 must exceed the specified voltage of zener diode 220 and similarly, the voltage $-V_{AMP}$ at terminal 140 must be less than the negative of the specified voltage of zener diode 222 (i.e. $-V_D$). If either of these conditions are not met, the respective transistor 228 or 230 will fall out of regulation and the voltage at terminals 173 or 174 will no longer be regulated.

Consequently, the control electronics block 124 must be modified to ensure that the voltages $+V_{AMP}$ and $-V_{AMP}$ generated by amplifier power supply block 128 at terminals 138 and 140 meet these minimum and maximum voltage requirements. While this will decrease the efficiency of the improved composite bridge amplifier 120 (by increasing the headroom between the supply voltage to the bridge amplifier 144 and the output voltage across load 146 when the output voltage is at a low level), the efficiency loss is compensated for by the decreased cost of the improved composite bridge amplifier 120. One skilled in the art will be capable of making these modifications to the control electronics block.

To minimize the efficiency loss resulting from the requirement that the amplifier power rails $+V_{AMP}$ and $-V_{AMP}$ must always maintain specified minimum voltage levels, the control electronics block 124 and the preconditioning electronics block 122 should be modified to operate on as low a voltage as possible.

It is preferable to generate the low voltage power rails $+V_{CC}$ and $-V_{CC}$ from the time varying amplifier power rails $+V_{AMP}$ and $-V_{AMP}$ rather than from the fixed DC voltages $+V_{DC}$ and $-V_{DC}$ generated by AC power rectification block 126 at terminals 157 and 158. One skilled in the art will recognize that DC voltages $+V_{DC}$ and $-V_{DC}$ will, at all times, have a greater magnitude than the time varying DC voltage $+V_{AMP}$ and $-V_{AMP}$. Consequently, if the DC voltages $+V_{DC}$ and $-V_{DC}$ were used to generate the low voltage power rails $+V_{CC}$ and $-V_{CC}$ a larger voltage would have to be dropped in the regulator block 202, increasing the power consumption of the improved composite bridge amplifier 120.

As stated above, the amplifier power rails $+V_{AMP}$ and $-V_{AMP}$ must be symmetric about ground. In the prior art composite bridge amplifier, power was supplied separately to the bridge amplifier 44 (from amplifier power supply block 28) and the control electronics block 24 and the preconditioning electronics block 22 (from the low voltage power supply block 60). One skilled in the art will appreciate that the bridged output stage of the bridge amplifier 44 allowed for all load currents produced in load 46 to flow directly from the positive power input at terminal 38 to the negative power input at terminal 40 of the bridge amplifier 44. As a result, no related ground current was generated in the bridge amplifier 44 and the amplifier power supply block did not have to be adapted to eliminate any such ground current, for example, by referencing the amplifier power rails $+V_{AMP}$ and $-V_{AMP}$ to ground.

The control electronics block 24 and the preconditioning electronics block 22 produce ground currents and the return path for these ground currents was provided through the center tap of the secondary winding 62, as discussed above. In the improved composite bridge amplifier 120 these ground currents will be directed to the amplifier power supply block 128 through the regulator block 202. As a result, the amplifier power rails $+V_{AMP}$ and $-V_{AMP}$ may become asymmetric with respect to ground.

This problem is solved by centering block 200 (FIG. 4), which compensates for the imbalanced ground currents generated in the control electronics block 124 and the preconditioning electronics block 122 by creating a bias point against which any imbalanced currents in the time-varying amplifier voltage rails $+V_{AMP}$ and $-V_{AMP}$ are compared and adding a compensatory current into the appropriate amplifier voltage rail $+V_{AMP}$ or $-V_{AMP}$. The centering block is comprised of resistors 204, 206, 210 and 212, amplifier 208, NPN transistor 214 and PNP transistor 216. Resistors 204 and 206, which must be of equal resistance, are connected in series between terminals 138 and 140. The non-inverting input of amplifier 208 is connected between resistors 204 and 206 at terminal 217. The gain of amplifier 208, which is connected as a non-inverting amplifier, is controlled by resistor 210, which is connected between the inverting input of amplifier 208 and ground, and by resistor 212, which is connected between the negative input and the output of amplifier 208. The output of amplifier 208 is connected to terminal 218. The base inputs of transistors 214 and 216 are also connected to terminal 218. The collector of NPN transistor 214 is connected to the $+V_{AMP}$ rail at terminal 138 and the emitter of transistor 214 is connected to ground. The collector of PNP transistor 216 is connected to the $-V_{AMP}$ rail at terminal 140 and the emitter of transistor 216 is connected to ground.

The centering block 200 operates as follows. If an imbalanced current (i.e. a ground current) is generated in the control electronics block 124 or the preconditioning electronics block 122 or in any other component which receives its power from the amplifier rails $+V_{AMP}$ or $-V_{AMP}$ (either directly or through the low voltage power rails $+V_{CC}$ or $-V_{CC}$ generated by low voltage power supply block 160), the amplifier rails $+V_{AMP}$ or $-V_{AMP}$ will not be symmetric with respect to ground. This will cause the voltage at terminal 217 to be non-zero. This non-zero voltage will be amplified by amplifier 208 and the resulting amplified voltage, which will appear at terminal 218, is used to control the operation of transistors 214 and 216. If the voltage at terminal 218 is positive, transistor 214 will operate in its active region and will drain current from the positive amplifier voltage rail $+V_{AMP}$. If the voltage at terminal 218 is negative, transistor 216 will operate in its active region and will add current to the negative amplifier voltage rail $-V_{AMP}$. One skilled in the art will be able to select appropriate resistances for resistors 210 and 212 to ensure that the centering network does not overcompensate or undercompensate for any imbalanced current in the amplifier power rails $+V_{AMP}$ and $-V_{AMP}$.

In this manner, the centering block 200 effectively references the low voltage power rails $+V_{CC}$ and $-V_{CC}$ generated by the regulator block 202 to ground, despite the lack of a ground reference for the time-varying amplifier power rails $+V_{AMP}$ and $-V_{AMP}$. As a result, any imbalanced current generated in the control electronics block 124 or the preconditioning electronics block 122 will be compensated for by the centering network and the amplifier voltage rails $+V_{AMP}$ and $-V_{AMP}$ will remain symmetric about ground. In addition, the centering network will compensate for any imbalanced current generated in the power gain stage 144, reducing the need to have precisely balanced voltage sources (V1 to V4) and permitting construction of the power gain stage with less expensive components.

If the performance criteria for the improved composite bridge amplifier 120 permit it, the centering network may be manufactured without amplifier 208 and resistors 210 and 212. In this case, terminals 217 and 218 are connected together and to the bases of transistors 214 and 216. This configuration will be less sensitive to any asymmetry of the amplifier voltage rails $+V_{AMP}$ and $-V_{AMP}$ about ground, but may be manufactured at lower cost.

Figure 5:
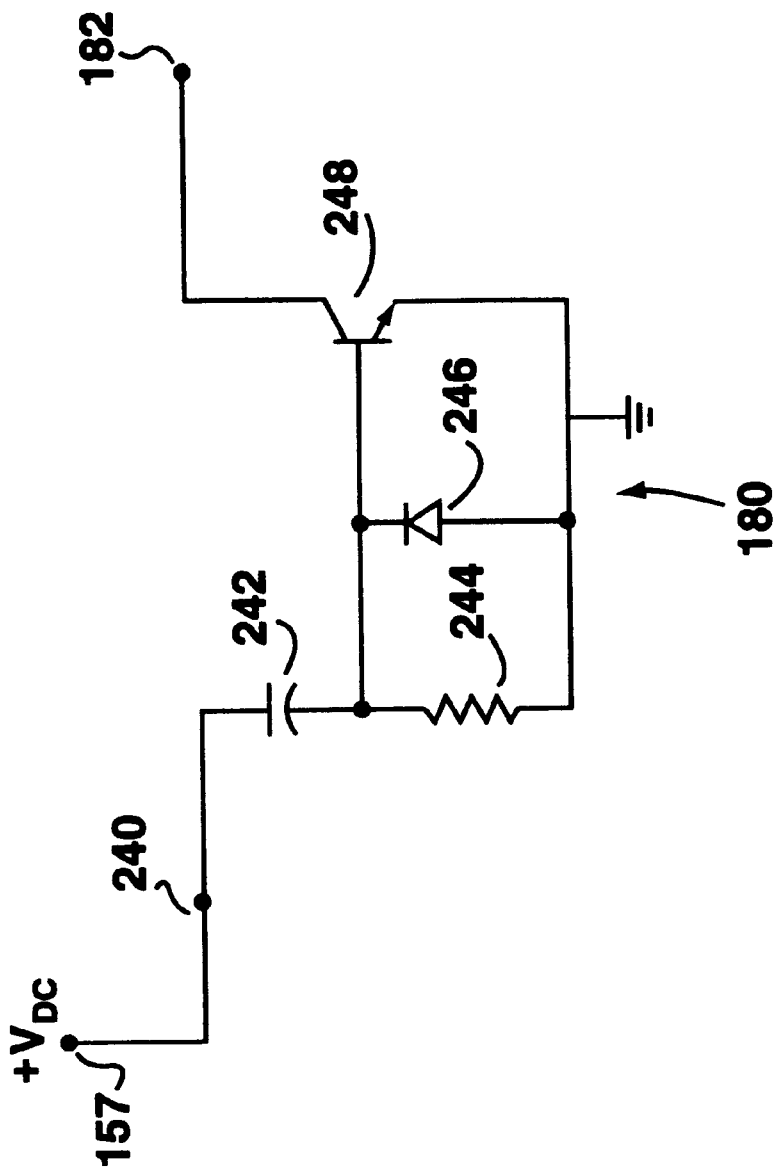
FIG. 5 is a schematic of the startup circuit of FIG. 3.

Startup Control Block 180 (FIG. 5)

Reference is next made to FIG. 5, which shows the startup block 180 in detail. The startup block 180 is comprised of terminals 240 and 182, capacitor 242, resistor 244, diode 246 and NPN transistor 248.

Terminal 240 is connected to the positive DC output voltage $+V_{DC}$ of rectifier 156 at terminal 157, as discussed above. Capacitor 242 is coupled between terminal 240 and the base of transistor 244. Resistor 248 is connected between the base of transistor 248 and ground. The cathode of diode 246 is connected to the base of transistor 248 and the anode of diode 246 is connected to ground. The emitter of transistor 248 is connected to ground and the collector of transistor 248 is connected to terminal 182. Terminal 182 is coupled to the control electronics block 124, which must ensure that terminal 182 is coupled to $+V_{DC}$ through a pull-up resistor.

The startup block 180 provides a startup signal to the control block 124 when the improved composite bridge amplifier is first turned. The startup signal is generated until sufficient time has passed for the amplifier power supply block, under the control of control electronics block 124, to generate amplifier power rails $+V_{AMP}$ and $-V_{AMP}$ and for the low voltage power supply block to generate low voltage power rails $+V_{CC}$ and $-V_{CC}$ and for all of the voltage rails to become stable.

The startup control block 180 operates as follows. When the improved composite bridge amplifier is turned on, amplifier power rectification block 126 will generate positive and negative DC voltages $+V_{DC}$ and $-V_{DC}$ at terminals 157 and 158, as described above. The positive DC voltage at terminal 240 (which is coupled to terminal 157) will charge capacitor 242, causing transistor 248 to turn on. The voltage at terminal 182 will fall. This low voltage at terminal 182 comprises the startup signal. Capacitor 242 will be discharged to ground through resistor 244 and eventually the base voltage of transistor 248 will fall below the base-emitter voltage of transistor 248, causing transistor 248 to turn off. The collector voltage will then be pulled up through the pull-up resistor described above, ending the startup signal. Diode 246 ensures that the base voltage of transistor 248 remains higher than the base-emitter voltage of transistor 248 while capacitor 242 is discharging.

The length of the startup signal will depend on the particular application of the improved composite bridge amplifier, and one skilled in the art will be capable of selecting capacitor 242 and resistor 244 to ensure that the startup signal does not end before voltage rails $+V_{AMP}$, $-V_{AMP}$, $+V_{CC}$ and $-V_{CC}$ have become stable.

Figure 6:
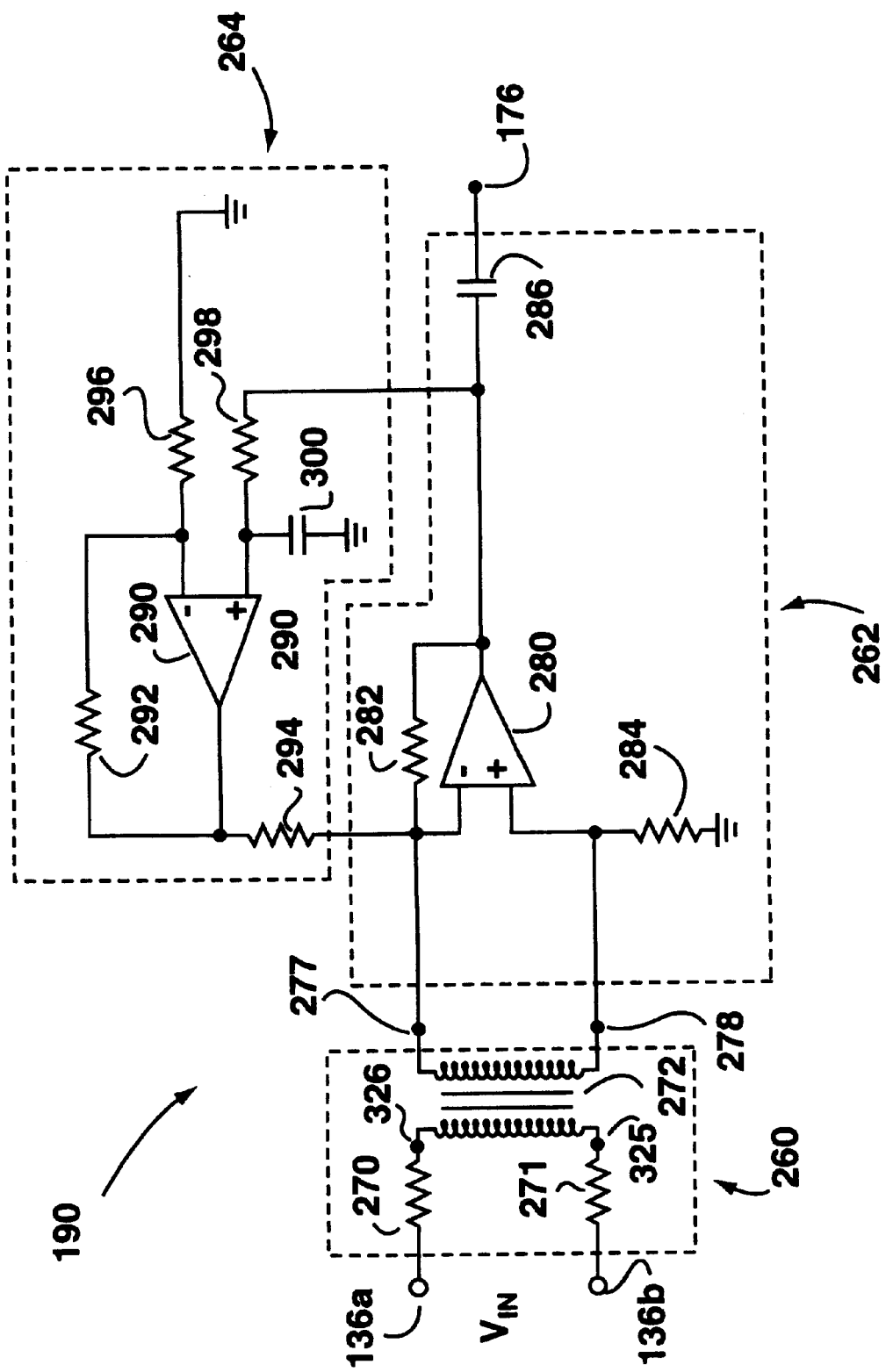
FIG. 6 is a schematic of a first embodiment of the isolation circuit of FIG. 3.

Input Signal Isolation Block 190 (FIG. 6)

Reference is now made to FIG. 6, which shows a first embodiment of the safety isolation block 190 in detail.

In the prior art composite bridge amplifier 20, safety isolation was provided by power transformer 52. As described above, this transformer is not used in the improved composite bridge amplifier 120 and safety isolation is provided instead by safety isolation block 190.

The safety isolation block 190 is comprised of a current transformer circuit 260, an input circuit 262 and a servo circuit 264.

Current transformer circuit 260 is comprised of resistors 270 and 271 and transformer 272. Transformer 272 has a primary start terminal 326, a primary finish terminal 325, a secondary start terminal 277 and a secondary finish terminal 278. Resistors 270 and 271 are connected in series with the primary winding of transformer 272 as shown across terminals 136a and 136b, to which input signal $V_{in}$ is coupled. Resistors 270 and 271 convert the input signal $V_{in}$, which represents the signal to be amplified as a voltage, into a current signal. Transformer 272 transforms this current signal into an isolated proportional current signal at terminals 277 and 278. If the input signal $V_{in}$ was input directly to transformer 272 without conversion into a current signal and input circuit 262 was changed to a voltage driven circuit (as described below), transformer 272 would act as a voltage transformer and would have to support large volt-seconds without any distortion. Such a transformer is costly and would add to the expense of the improved composite bridge amplifier 120. Conversion of the input signal $V_{in}$ into a current signal permits a less expensive transformer to be used with little distortion of the input signal. Transformer 272 provides safety isolation between the input terminal 136 and the AC voltage supply $V_{AC}$.

The input circuit 262 comprises resistors 282 and 284, capacitor 286 and differential amplifier 280, which comprises an op amp. Terminal 277 is connected to the inverting input of differential amplifier 280 and terminal 278 is connected to the non-inverting input of differential amplifier 280. Resistor 284 is connected between the non-inverting input of differential amplifier 280 and ground. Resistor 282 is connected as a feedback resistor between the output and inverting input of differential amplifier 280. Capacitor 286 is connected between the output of differential amplifier 280 and terminal 176 (which is coupled to the preconditioning electronics block 122).

Optionally, terminals 277 and 278 may be coupled to the inverting and non-inverting inputs of differential amplifier 280 through a pair of resistors (not shown). These resistors may be useful to guard against damage to the differential amplifier 280 by electrostatic discharge. If such resistors are used, their resistances should be minimized to ensure that the secondary winding of transformer 272 is effectively terminated by the virtual short between the non-inverting and inverting terminals of differential amplifier 280. If these resistances are not minimized input circuit 262 will operate as a voltage driven circuit.

Input circuit 262 converts the current through the secondary winding of transformer 272 to an amplified signal which is dependent on the input $V_{in}$, through capacitor 286, at terminal 176. The use of differential amplifier 280 in the input circuit provides a high common mode noise rejection ratio, reducing the effect of any common mode currents introduced by parasitic capacitance across transformer 272. It is found that the common mode noise rejection ratio will be improved if transformer 272 is selected to have a low parasitic capacitance. The capacitance could be represented by two distinct, lumped, equivalent elements. The first element, defined here as the start terminal capacitance, is between the primary start terminal 326 and the secondary start terminal 277. The second element, defined here as the finish terminal capacitance, is between the primary finish terminal 325 and the secondary finish terminal 278. It is preferred that each of these capacitances be less than 10 pF and the source impedance of the device providing the input signal $V_{in}$ be less than 1 kΩ. The benefit of an improved common mode noise rejection ratio will be diminished if the difference between the start terminal capacitance and the finish terminal capacitance exceeds 0.1 pF. The benefit will be substantially lost if the difference exceeds 0.4 pF.

Transformer 272 will normally have a low DC impedance relative to the feedback resistor 282. As a result, the output of the differential amplifier 280 may suffer from a DC offset. This effect may be reduced by the selection of an appropriate feedback resistor 282 and an appropriate op amp for use as differential amplifier 280 and such a selection will be within the capabilities of one skilled in the art. The effect of a DC offset is further minimized by capacitor 286. Capacitor 286 acts as an AC coupler and will filter out DC components in the output of differential amplifier 280.

If the DC offset is relatively large, it may limit the dynamic range of differential amplifier 280 substantially, and consequently limit the dynamic range of the input signal $V_{in}$ which may be amplified by the improved composite bridge amplifier 120. To correct such a large DC offset, the servo circuit 264 may be added.

The servo circuit 264 comprises op amp 290, resistors 292, 294, 296 and 298 and capacitor 300. Resistor 298 is connected between the non-inverting input of op amp 290 and the output of differential amplifier 280. Capacitor 300 is connected between the non-inverting input of op amp 290 and ground. Resistor 296 is connected between the inverting input of op amp 290 and ground. Resistor 292 is a feedback resistor connected between the output and inverting input of op amp 290. Resistor 294 couples the output of op amp 290 to the inverting input of differential amplifier 280.

Servo circuit 264 actively removes the DC offset from the output of differential amplifier 280 as follows. Resistor 298 and capacitor 300 act as a low pass filter causing the average DC offset in the output of differential amplifier 280 to be directed to the non-inverting input of op amp 290. Op amp 290 is configured as a non-inverting amplifier, the gain of which is controlled in known manner by resistors 292 and 296, and the output of op amp 290 is an amplified DC signal corresponding to the average DC offset in the output of differential amplifier 280. This amplified DC signal is directed to the inverting input of differential amplifier 280 through resistor 294 and is effectively subtracted from the output of differential amplifier 280.

Figure 7:
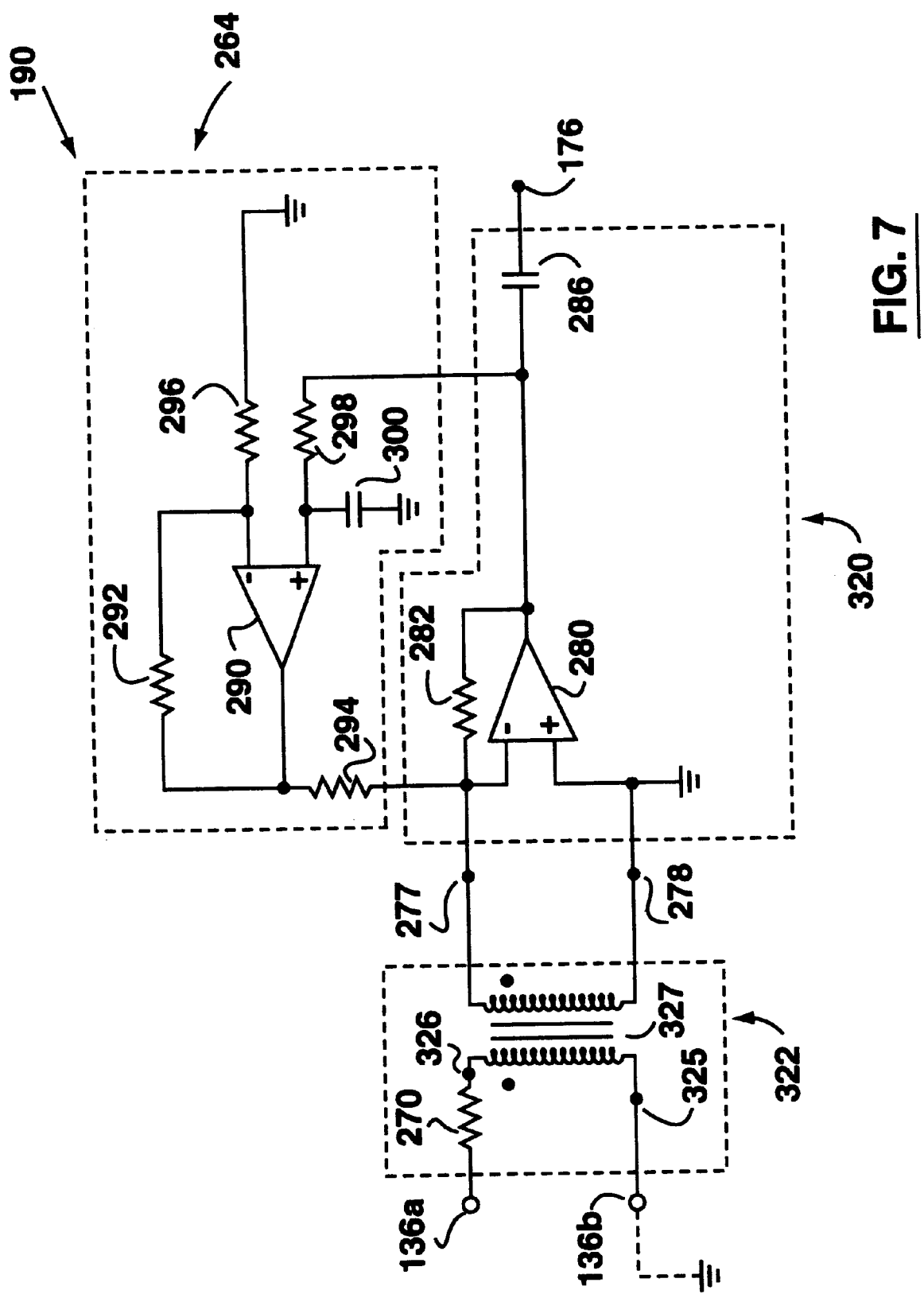
FIG. 7 is a schematic of a second embodiment of the isolation circuit of FIG. 3.

Reference is next made to FIG. 7, which shows a second embodiment of the safety isolation block 190', which can provide improved common mode noise rejection. Elements in FIG. 7 which correspond to identical elements in FIG. 6 have been given the same reference numbers. Safety isolation block 190' comprises a current transformer circuit 322, an input circuit 320 and a servo circuit 264. Servo circuit 264 remains unchanged from the embodiment of FIG. 6 and will not be described further.

Current transformer circuit 322 comprises a transformer 324 and a resistor 270, which is connected between input terminal 136a and one side of the primary winding of transformer 324. The other side of the primary winding of transformer 324 is connected to the signal ground of the input signal $V_{in}$ at input terminal 136b. The secondary winding of transformer is connected across terminals 277 and 278. Terminal 278 is connected to ground. The improved common noise rejection ratio provided by this second embodiment 190' of the safety isolation circuit will be best achieved if the geometry of transformer 324 is arranged such that the current through the start terminal capacitance (as defined above with reference to FIG. 6) and the current through the finish terminal capacitance (as defined above with reference to FIG. 6) cancel the current magnetically induced in the secondary winding of transformer 324 by the current in the primary winding of transformer 324. This is shown in FIG. 7 by the polarity dots beside the primary start terminal 326 and the secondary start terminal 277 of transformer 324. In this second embodiment 190', it is not necessary to ensure that the start terminal capacitance and the finish terminal capacitance are equal. The benefit of improved common mode noise rejection will be maintained even if the ratio between the two capacitances is as high as 10 to 1 (or 1 to 10). However, both the start terminal capacitance and the finish terminal capacitance should preferably be less than 6 pF in the geometry shown. Ideally, both capacitances are less than 3 pF.

Input circuit 320 is comprised of differential amplifier 280, a resistor 282 and a capacitor 286. Resistor 282 and capacitor 286 are connected and operate in the same manner as the embodiment of FIG. 6, and therefore do not require further explanation here. The inverting input of differential amplifier 280 is connected to terminal 277 and the non-inverting terminal of differential amplifier 280 is connected to ground. Input circuit 320 provides an amplified signal at terminal 176 corresponding to input signal $V_{in}$ received at terminals 136a and 136b in the manner as the input circuit 262 of FIG. 6.

It should be noted that while certain geometries are disclosed in FIGS. 6 and 7, other geometries can also be used, so long as the currents charging the parasitic capacitances across the transformer with common mode noise voltages cancel the noise current in the secondary winding of the transformer. The charging current or currents necessary for this task can be those of either the start capacitance, or the finish capacitance, or a combination of the two. Depending on the geometry, the parasitic capacitances can have values other than those listed above.

Although the embodiments of the present invention which have been described have particular application in the amplification of audio signals, it will be apparent to one skilled in the art that the present invention may be used in other contexts and that other embodiments fall within the spirit and scope of the invention, as defined by the following claims.

What is claimed is:

1. An amplifier for amplifying an input signal, said amplifier comprising:
   (a) a signal input terminal for receiving said input signal;
   (b) a safety isolation circuit coupled to said signal input terminal and having an isolated signal terminal, said safety isolation block being adapted to provide a physical isolation between said signal input terminal and said isolated signal terminal and being adapted to provide a signal corresponding to said input signal at said isolated signal terminal;
   (c) a signal amplifier block having first and second voltage input terminals and a control terminal, said control terminal being coupled to said isolated signal terminal;
   (d) an AC power rectification block for providing a fixed DC voltage at first and second DC voltage terminals;
   (e) an amplifier power supply block coupled to said first and second DC voltage terminals for producing at said first and second voltage input terminals a time-varying non-ground referenced DC voltage dependent on said input signal;
   (f) an amplifier power control circuit coupled to said signal input terminal and said amplifier power supply block for controlling said time-varying non-ground referenced DC voltage;
   (g) a startup block adapted to automatically generate a startup signal when said amplifier is initially energized and coupled to said amplifier power control circuit, said amplifier power control circuit being responsive to said startup signal to control said amplifier power supply block such that said amplifier power supply block produces a fixed non-ground referenced DC voltage at said first and second voltage input terminals for a selected period of time;
   (h) an electronics power supply circuit having first and second fixed DC voltage output terminals, said electronics power supply circuit being coupled to said first and second voltage input terminals for receiving said time-varying non-ground referenced DC voltage and for producing a fixed DC voltage at said first and second DC voltage output terminals from said time-varying non-ground referenced DC voltage.

2. The amplifier of claim 1 wherein said electronics power supply circuit further comprises:
   (a) a regulator block coupled to said first and second voltage input terminals and to said first and second DC voltage output terminals and having an output voltage fixing block and a voltage drop block; and
   (b) a centering block for removing unbalanced DC voltages at said first and second voltage input terminals, said centering block being coupled to said first and second voltage input terminals and comprising a bias point block for establishing a bias voltage and a current compensation block coupled to said bias point block and responsive to said bias voltage for providing currents to balance the voltages at said first and second voltage input terminals.

3. The amplifier of claim 2 wherein said centering block includes a circuit for comparing said bias voltage with ground.

4. The amplifier of claims 2 or 3 wherein said output voltage fixing block and voltage drop block include a circuit for fixing the voltage at said first and second DC voltage output terminals.

5. The amplifier of claim 2, wherein said output voltage fixing block comprises first and second zener diodes and said voltage drop block comprises first and second voltage drop resistors, said first voltage drop resistor being coupled between said first voltage input terminal and the cathode of said first zener diode, the anode of said first zener diode being coupled to the cathode of said second zener diode and to ground, said second voltage drop resistor being coupled between the anode of said second zener diode and said second voltage input terminal, and the cathode of said first zener diode being coupled to said first voltage output terminal and the anode of said second zener diode being coupled to said second voltage output terminal.

6. The amplifier of claim 5, wherein said output voltage drop block further comprises an N type voltage drop transistor and a P type voltage drop transistor, each of said N and P type voltage drop transistors having a base input, an emitter output and a collector output, the base input of said N type voltage drop transistor being coupled to the cathode of said first zener diode, the collector output of said N type voltage drop transistor being coupled to said first voltage input terminal and the emitter output of said N type voltage drop transistor being coupled to said first voltage output terminal and the base input of said P type voltage drop transistor being coupled to the anode of said second zener diode, the collector output of said P type voltage drop transistor being coupled to said second voltage input terminal and the emitter output of said P type voltage drop transistor being coupled to said second voltage output terminal.

7. The amplifier of claim 2 wherein said bias point block comprises first and second resistors, said first resistor being coupled between said first input voltage terminal and a bias voltage terminal and said second resistor being coupled between said bias voltage terminal and said second input voltage terminal, and wherein said current compensation block comprises an N type compensation transistor and a P type compensation transistor, each of said compensation transistors having a base input, an emitter output and a collector output, the base inputs of said N and P type compensation transistors being coupled together and coupled to said bias voltage terminal, the collector output of said N type compensation transistor being coupled to said first voltage input terminal, the collector output of said P type compensation transistor being coupled to said second voltage input terminal and the emitter outputs of said N and P type compensation transistors being coupled together and to ground.

8. The amplifier of claim 7 wherein said current compensation block further comprises an amplifier coupled between said bias voltage block and the base inputs of said N and P type compensation transistors.

9. The amplifier of claim 1 wherein said safety isolation circuit further comprises:

(a) an input block comprising an input amplifier having an input amplifier, input and output terminals and a coupling capacitor coupled between said output terminal of said input amplifier and said isolated signal terminal; and (b) an isolation block comprising an isolation transformer having a primary winding having a primary start terminal and a primary finish terminal, and a secondary winding having a secondary start terminal and a secondary finish terminal, there being a parasitic capacitance between said windings representable as a start terminal capacitance between said start terminals and a finish terminal capacitance between said finish terminals, said primary winding being coupled to said signal input terminal, said secondary winding being coupled to said input amplifier input terminal through first and second resistors, said input amplifier being connected as a differential amplifier and said isolation transformer being selected such that the start terminal capacitance and the finish terminal capacitance are each less than 10 pF and such that the difference between the start terminal capacitance and finish terminal capacitance is less than 0.4 pF, and wherein the source impedance of said input device is less than 1 kΩ.

10. The safety isolation circuit of claim 9 wherein the difference between the start terminal capacitance and the finish terminal capacitance is less than 0.1 pF.

11. The amplifier of claim 1 wherein said safety isolation circuit further comprises:

(a) an input block comprising an input amplifier having an input amplifier, input and output terminals and a coupling capacitor coupled between said output terminal of said input amplifier and said isolated signal terminal; and (b) an isolation block comprising an isolation transformer having primary and secondary windings, said primary winding having a primary start terminal and a primary finish terminal, said secondary winding having a secondary start terminal and a secondary finish terminal, there being a parasitic capacitance between said windings representable as a start terminal capacitance between said start terminals and a finish terminal capacitance between said finish terminals, said primary start terminal being coupled to said signal input terminal through a resistor, said primary finish terminal being connected to said signal input terminal, said secondary start terminal being connected to said amplifier input terminal, said secondary finish terminal being connected to said input amplifier terminal and to ground, said isolation transformer is configured such that currents charging said start terminal capacitance and said finish terminal capacitance with common mode noise voltage tend to cancel a noise current in said secondary winding.

12. The amplifier of claim 11 wherein said first terminals of said primary and secondary windings have the same polarity and said isolation amplifier is selected such that the ratio between start terminal capacitance and the finish terminal capacitance does not exceed 10 to 1 and is not less than 1 to 10, and said isolation amplifier is selected such that the start terminal capacitance and the finish terminal capacitance are each less than 6 pF.

13. The safety isolation circuit of claim 11 wherein said isolation amplifier is selected such that the start terminal capacitance and the finish terminal capacitance are each less than 3 pF.

14. The amplifier of claim 9, 10, 11, 12 or 13, wherein said safety isolation circuit further comprises a servo compensation circuit for removing DC components from said isolated signal comprising a low pass filter and a servo amplifier having servo amplifier input and output terminals, said low pass filter being coupled between said coupling capacitor and said servo amplifier input terminal and said servo amplifier output terminal being coupled to said input amplifier.

* * * * *

UNITED STATES PATENT AND TRADEMARK OFFICE
CERTIFICATE OF CORRECTION

PATENT NO.     : 6,160,455
DATED          : December 12, 2000
INVENTOR(S)    : John B. French and David I.W. Russel It is certified that error appears in the above-identified patent and that said Letters Patent is hereby corrected as shown below:

Column 5,
Line 58, please insert a minus sign "-" in front of the letters $V_{AMP}$ so that the line reads -- rails + $V_{AMP}$ and - $V_{AMP}$ at terminal 138 and 140 respectively. --

Column 9,
Line 64, please inverse the reference numerals "244" and "248" so that the line reads -- the base of transistor 248. Resistor 244 is connected between --.

Signed and Sealed this

Fourteenth Day of May, 2002

*Attest:*

JAMES E. ROGAN
*Attesting Officer*  *Director of the United States Patent and Trademark Office*